United States Patent
Tan et al.

(10) Patent No.: US 10,209,297 B2
(45) Date of Patent: Feb. 19, 2019

(54) LOW COST APPARATUS FOR INSITU TESTING OF PACKAGED INTEGRATED CIRCUITS DURING STRESSING

(71) Applicant: Texas Instruments Incorporated, Dallas, TX (US)

(72) Inventors: Ning Tan, Allen, TX (US); Jose Abdiel Rodriguez-Latorre, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 492 days.

(21) Appl. No.: 14/992,148

(22) Filed: Jan. 11, 2016

(65) Prior Publication Data

US 2017/0199238 A1    Jul. 13, 2017

(51) Int. Cl.
*G01R 31/28* (2006.01)
*G01R 1/04* (2006.01)

(52) U.S. Cl.
CPC ....... *G01R 31/2875* (2013.01); *G01R 1/0458* (2013.01)

(58) Field of Classification Search
CPC .......................... G01R 31/2875; G01R 1/0458
See application file for complete search history.

(56) References Cited

U.S. PATENT DOCUMENTS

| | | | | |
|---|---|---|---|---|
| 5,164,661 A | * | 11/1992 | Jones | G01R 31/2874 219/209 |
| 6,900,650 B1 | * | 5/2005 | Sheng | G01R 31/2817 324/750.07 |
| 7,394,271 B2 | | 7/2008 | Lopez et al. | |
| 7,701,238 B2 | | 4/2010 | Wong et al. | |
| 2007/0075721 A1 | * | 4/2007 | Lopez | G01K 1/16 324/750.07 |

* cited by examiner

*Primary Examiner* — Daniel Miller
(74) *Attorney, Agent, or Firm* — Rose Alyssa Keagy; Charles A. Brill; Frank D. Cimino (57) ABSTRACT

An apparatus with a burn-in board containing a microcontroller unit and a heater socket for insitu testing of a packaged integrated circuit while under stress. A method for insitu testing of a packaged integrated circuit while under stress. A method for insitu testing of multiple packaged integrated circuits while under stress.

22 Claims, 7 Drawing Sheets

LOW COST APPARATUS FOR INSITU TESTING OF PACKAGED INTEGRATED CIRCUITS DURING STRESSING

FIELD

This invention relates to the field of integrated circuits. More particularly, this invention relates to accelerated stress testing of integrated circuits.

BACKGROUND

Elevated voltage and/or thermal stresses are applied to integrated circuit chips (IC) during qualification testing to determine if the ICs will remain functional for 10 years in the field. The stress time needed to project 10 year IC reliability depends upon the stress voltage and stress temperature applied to the IC during accelerated testing. For example an IC that needs to survive at 80° C. for 10 years may be stress tested for 6 months with a stress temperature of 100° C. or for a shorter period of time if a more elevated stress temperature is used (ie. 120° C.). Similarly an IC that operates at a power supply voltage of 1 volt may be stress tested for 6 months with a stress voltage of 1.25 volts or may be tested for a shorter time if the stress voltage more elevated (ie. 1.5 volts). Typically ICs are tested with elevated stress temperature and with elevated stress voltage during qualification testing to reduce testing time.

The accelerated testing time interval may be many weeks or many months. The accelerated stress testing is typically interrupted at predetermined testing points distributed throughout the qualification testing time to determine if any failures have occurred. The frequency of testing points is typically higher at the beginning of the qualification test and end of the qualification test to determine if the failure rate is higher during these periods of testing. Conventional stress testing does not determine if multiple IC failures occurred randomly throughout the interval between testing points or if they occurred simultaneously at one time somewhere within the interval.

Figure 1:
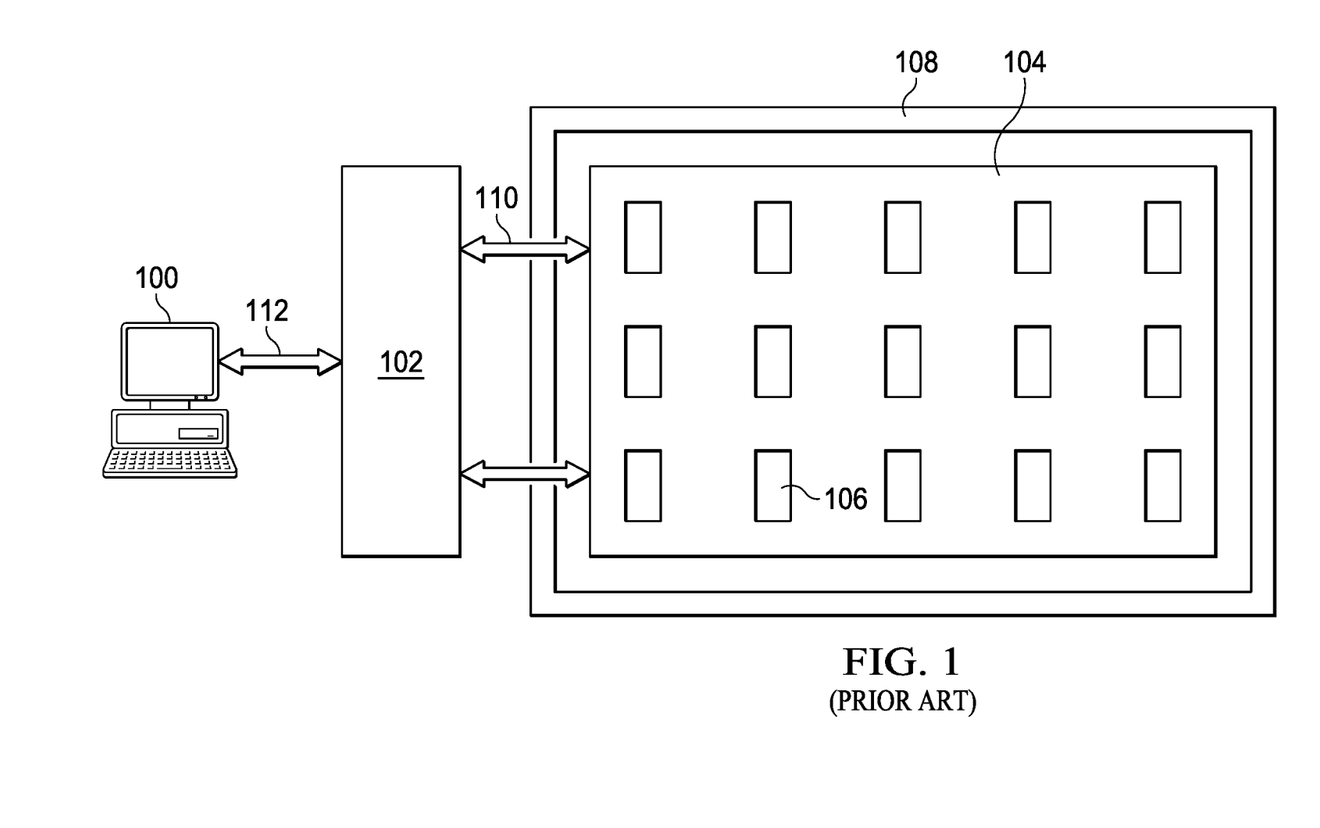
FIG. 1 (Prior art) is an apparatus for accelerated stress testing of integrated circuits.

A typical testing setup is illustrated in FIG. 1. A burn-in board 104 (or burn-in mother board) is populated with ICs 106 to be accelerated stress tested. The burn-in board 104 populated with ICs 106 is plugged into a communication socket 110 inside an burn-in oven 108. A driver interface board 102 is plugged into the communication socket 110 outside the burn-in oven 108. A computer (PC) 100 is connected to the driver interface board 102 to control the accelerated stress testing.

Figure 2:
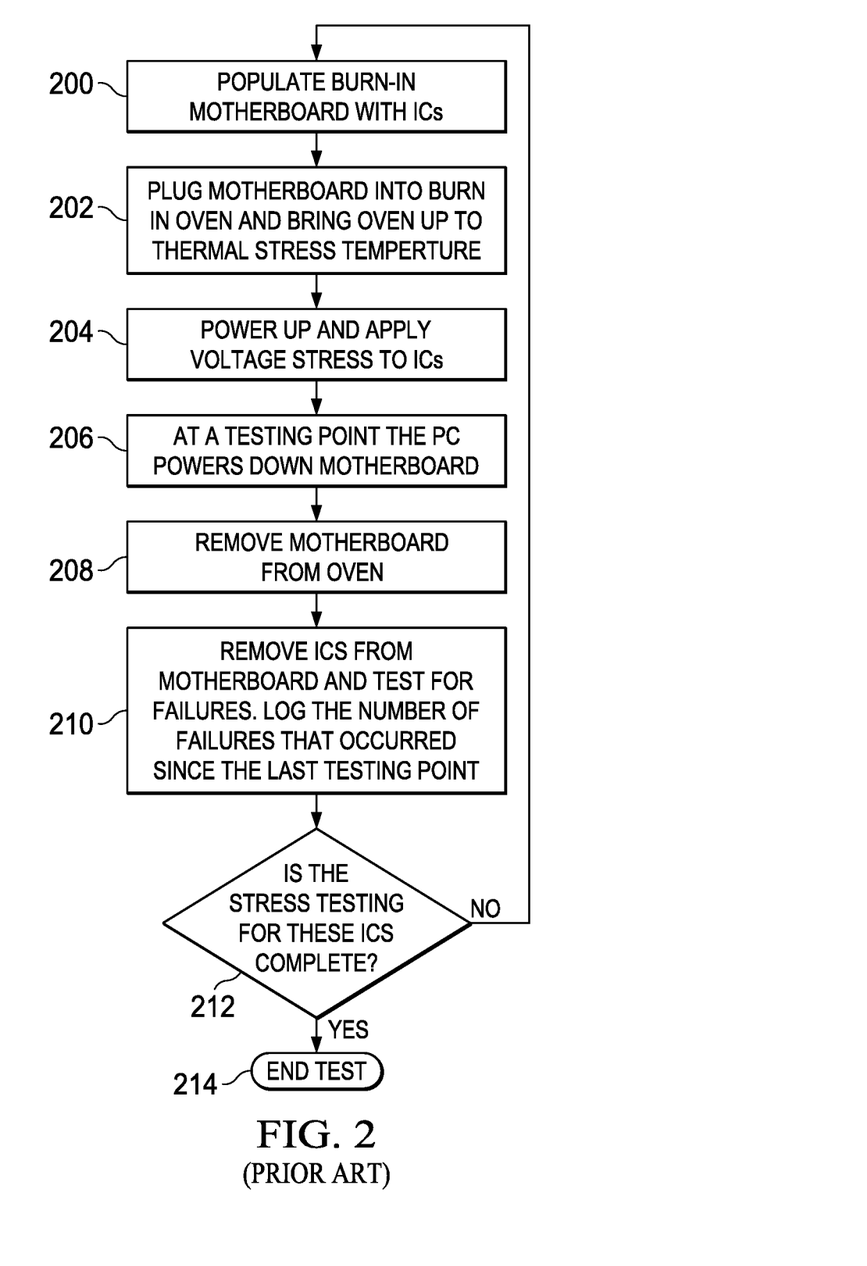
FIG. 2 (Prior art) is a flow diagram for accelerated testing of integrated circuits.

An example accelerated testing protocol is illustrated in FIG. 2.

In step 200 the burn-in mother board 104 is populated with packaged ICs 106 to be tested. Usually all the IC's 106 on the burn-in mother board 104 are the same.

In step 202 the burn-in mother board 104 is plugged into the communication socket 110 in the burn-in oven 108. The temperature of the burn-in oven 108 is then raised to the target thermal stress temperature.

In step 204 the computer 100 sends signals to the driver interface board 102 to begin testing. The computer may also communicate with the burn-in oven 108 to set the stress temperature. The driver interface board then powers up the burn-in mother board so that the packaged IC's become functional and may apply an elevated stress voltage to the ICs under test to initiate the accelerated testing.

In step 206, the PC 100 stops the test when a predetermined testing point (time) is reached.

In step 208 the motherboard is removed from the oven.

In step 210 the packaged ICs are removed from the motherboard and tested for failure. Automated Testing Equipment (ATE) may be used to determine functionality of the ICs 106.

Step 212 checks to see if the testing is complete. If testing is not complete the ICs 106 are plugged back into the burn-in mother board 104 in step 200 and another cycle of stress testing is initiated.

When the stress testing is complete, the stress testing is discontinued and the test is ended in step 214.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An apparatus with a burn-in board containing a microcontroller unit and a heater socket for insitu testing of a packaged integrated circuit while under stress. A method for insitu testing of a packaged integrated circuit while under stress. A method for insitu testing of multiple packaged integrated circuits while under stress.

DETAILED DESCRIPTION OF EXAMPLE EMBODIMENTS

Embodiments of the invention are described with reference to the attached figures. The figures are not drawn to scale and they are provided merely to illustrate the invention. Several aspects of the embodiments are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The embodiments are not limited by the illustrated ordering of acts or events, as some acts may occur in different orders and/or concurrently with other acts or events. Furthermore, not all illustrated acts or events are required to implement a methodology in accordance with the present invention.

Figure 3:
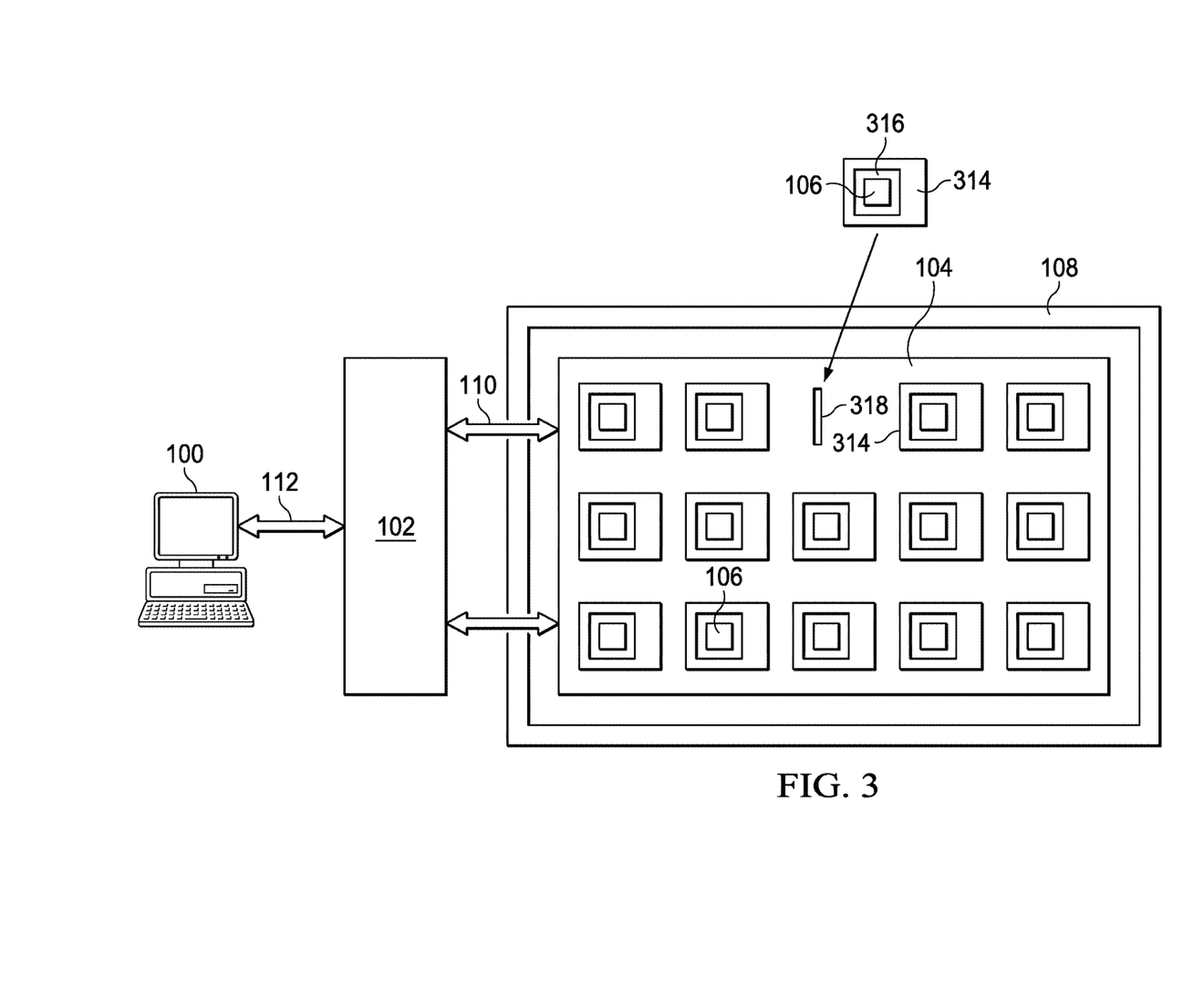
FIG. 3 is a plan view of an apparatus for the insitu testing of integrated circuit under stress illustrating an embodiment of the principles of the invention

An example low cost apparatus for accelerated stressing of packaged ICs with insitu testing capability is illustrated in FIG. 3.

In this embodiment burn-in daughter boards 314 with heater sockets 316 containing the packaged ICs 106 to be stress tested are plugged into sockets 318 on the burn-in mother board 104. The burn-in daughter board is independent of the burn-in mother board and may easily be removed or plugged in. This flexibility has the advantage that a burn-in daughter board 314 with a failing packaged IC 106 may be quickly swapped out and replaced with a new packaged IC. In addition, if a component fails on a daughter board 314 the failing daughter board may be replaced with a good daughter board 314 and the stress testing continued. The circuitry of the daughter board could be hardwired on the mother burn-in board but then failure of a component on one of daughter boards would take down the entire mother board while repairs are being made.

This embodiment may utilize the same burn-in PC 100, the same driver interface board 102 and the same communication socket 110 that are used during conventional testing.

Figure 4A:
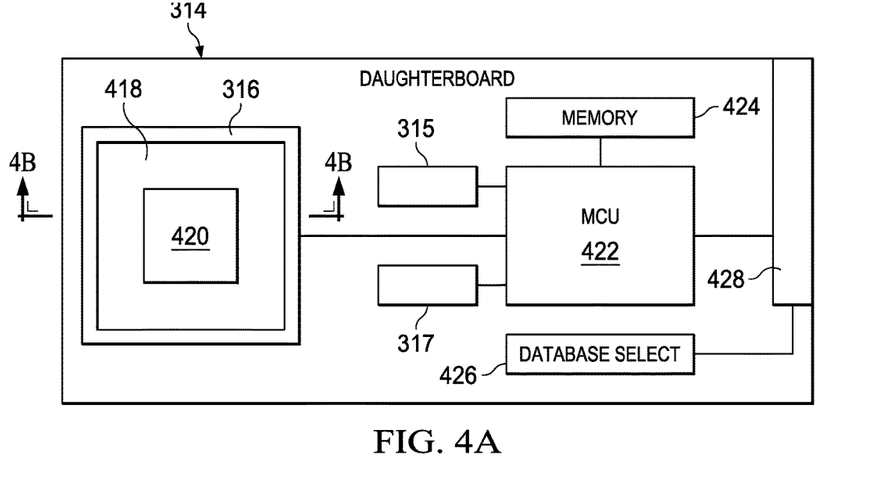
FIG. 4A is a plan view of a burn-in board for the insitu testing of integrated circuit under stress illustrating an embodiment of the principles of the invention.

Details of the burn-in daughter board (DB) 314 are shown in FIG. 4A. The burn-in daughter board 314 contains the heater socket 316 and a microcontroller unit 422 (MCU). The DB 314 also contains a DB select circuit 426 to enable the burn-in computer 100 to individually select each DB 314 on the burn-in mother board 104 and a male connector 428 that may be plugged into a female connector 318 mounted on the burn-in mother board 104. The burn-in daughter board 314 may also contain other subcircuits 315 and 317 that may perform such functions as a circuit to monitor the power consumption of the IC 106 under test, a circuit that enables dynamic power cycling of the IC 106, a circuit that enables dynamic temperature cycling while stressing the IC 106, and a circuit which enables arbitrary digital patterning driving and receiving.

The microcontroller unit (MCU) 422 may be programmed to apply stress voltages to the packaged IC 106 and also may be programmed to control the stress temperature of the heater 420 in the heater socket 316. The MCU 422 may also be programmed to run complex functional testing such as checking memory patterns and subcircuit functionality and also may be programmed to write test results and stress conditions into onboard memory 424. Additionally, the MCU may be programmed to send a signal to the PC 100 when the packaged IC 106 fails or begins to fail. The MCU may then turn off the accelerated voltage stress and/or the accelerated thermal stress to prevent additional damage to the packaged IC 106. In conventional testing the packaged IC 106 continues to be stressed for extended periods after failure. The additional stress may destroy the packaged IC 106 rendering it useless for failure analysis and making it impossible to determine which subcircuit on the packaged IC 106 failed or to determine which device in the subcircuit failed first.

A daughter board (DB) select subcircuit 426 on the burn-in daughter board 314 enables the burn-in computer 100 to select an individual burn-in daughter board 314 on the burn-in mother board 104 using for example I2C communication protocol. An electrical connector 428 on the burn-in daughter board 314 plugs into an electrical socket 318 on the burn-in mother board 104.

Figure 4B:
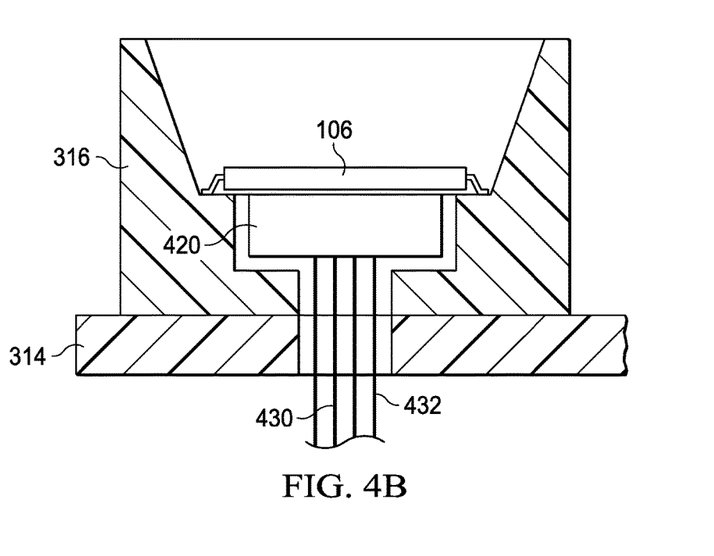
FIG. 4B is the cross section of an example heater socket.

A cross sectional view of the heater socket 316 with an integrated heater 420 is shown in FIG. 4B. The heater socket 316 is open at the top providing easy access for insertion and removal the packaged IC 106. The packaged IC 106 may be a packaged in a chip carrier with electrical contacts on all four sides of the chip carrier. The heater socket 316 is mounted on the burn-in daughter board 314. A separate heater unit 420 is mounted in a recessed opening in the heater socket 316 so that the top of the heater unit 420 directly contacts the bottom of the packaged IC 106 when the packaged IC 106 is inserted in the socket 316. Leads 430 that provide power to the heater unit 420. Leads 432 couple a temperature sensing device such as a thermocouple or thermistor to the MCU 422 providing active feedback control of the accelerated thermal stress. In the event the heater unit 420 fails, it may readily be replaced. Optionally the heater unit 420 may be built as an integral part of the heater socket 316, but the preferred embodiment is for a separate heater unit 420.

Figure 5:
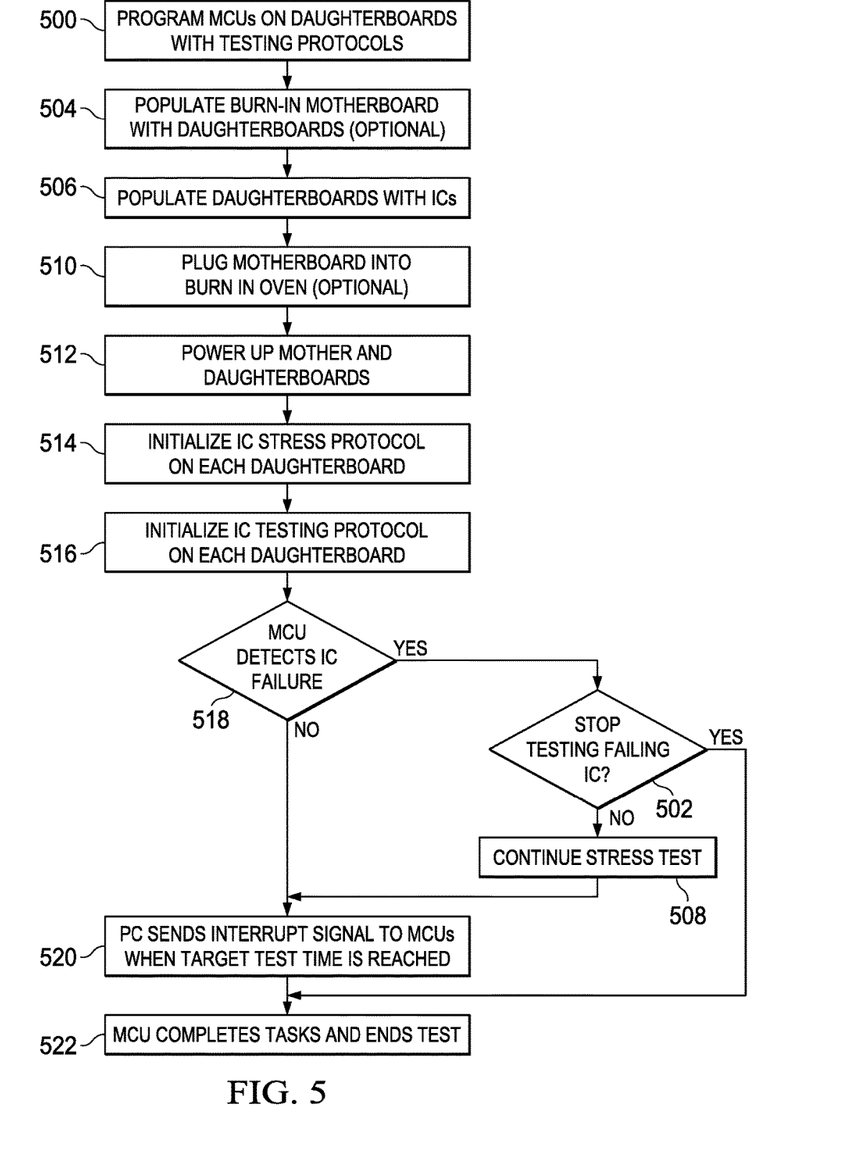
FIG. 5 is the flow diagram of a method for the insitu testing of an integrated circuit under accelerated stress.

An example accelerated testing protocol using this embodiment apparatus is illustrated in the flow diagram of FIG. 5.

In step 500 the MCU's 422 on the burn-in daughter boards are programmed with accelerated stress, testing protocols, and data acquisition and data saving protocols. Typically the programming of the MCU 422 is performed using a MCU programming PC and a separate burn-in PC 106 is used to run the prolonged accelerated stress testing.

In step 504 the burn-in mother board 104 is populated with burn-in daughter boards 314.

Optionally an interface board 102 may be designed to enable the PC 100 to program MCUs on the burn-in daughter boards 314 while they are plugged into the burn-in mother board 104 and to perform accelerated stress testing after the MCUs 422 are programmed. For this case the order of steps 500 and 504 may be reversed.

In step 510 the burn-in mother board containing the burn-in daughter boards is plugged into the burn in oven. This step is optional. The individual heaters are capable of raising the temperature of the packaged IC 106 under test to over 250° C. above ambient temperature. This enables individual packaged IC's 106 to be tested with different stress temperatures within a burn-in oven 108. This also enables the IC's 106 to be thermally stressed without the use of a burn-in oven 108.

In step 514 signals are sent from the burn-in PC 100 and driver interface 102 to initialize accelerate stressing of the packaged ICs 106 on each of the burn-in daughter boards 314. The MCUs 422 may apply the same stress conditions to each of the ICs 106 or may apply different stress conditions depending upon how each MCU 422 was programed in step 500 and depending upon which testing signals are sent from the burn-in PC 100 to each of the MCUs 422. For example, two MCUs on two different burn-in daughter boards 314 may be programmed identically in step 500 but may receive different testing signals from the burn-in PC 100 in step 516 so that the MCU on one burn-in daughter board 314 runs a full suite of tests whereas the MCU 314 on the other burn-in daughter board 314 runs a subset of the full suite of tests.

In step 516 signals are sent from the burn-in PC 100 and driver interface 102 to initialize testing of the packaged IC 106 on each burn-in daughter board 314. The MCUs 422 may apply the same testing protocol to each packaged IC 106 or may apply different testing protocols depending upon how each MCU 422 was programed in step 500. For example, a different memory pattern may be monitored on one packaged IC 106 versus another packaged IC 106.

In step 518 if the MCU on one of the burn-in daughter boards 314 detects a packaged IC 106 failure, it sends a signal to the burn-in PC 100 that the packaged IC 106 has failed. It may also send data regarding the accelerated stress conditions applied to the packaged IC 106 at the time the failure occurred, and also the type of failure that occurred. Alternatively the MCU 422 may be programmed in step 500 to immediately turn off the accelerated stress in the event of a failure and may be programmed to write the details of stress conditions and failure type and time into the onboard memory 424.

In step 502 the decision is made by the burn-in PC 100 or the MCU 422 to either terminate the test on the failing packaged IC 106 or to continue stress testing in step 508.

In step 520, when the target testing time is reached, the burn-in PC 100 sends and interrupt signal to each of the MCU's 422.

In step 522 each MCU completes the task is currently performing (such as functionality testing and writing data to memory) and then ends the test by removing the accelerated stress and powering the packaged IC down.

This embodiment offers a number of advantages. This embodiment records the exact time, stress conditions, and failure mode when each failure occurs. Using the conventional method described in the flow diagram in FIG. 2 the time interval between testing points may be many days or weeks. When several packages IC failures occur during the interval between testing points, it cannot be determined if they failed at random times throughout the interval or if they failed at the same time. If packaged IC failures occur at the same time it may be that a voltage spike from the testing apparatus caused the packaged ICs to fail. Simultaneous IC failures may not be indicative of the reliability of the packaged ICs but instead may be indicative of a problem with the testing apparatus. If simultaneous failures are misinterpreted to be the result of the accelerated stress, the packaged IC may incorrectly fail qualification and the qualification testing may then be repeated resulting in substantial additional cost and delay in time to market.

With this embodiment the accelerated testing continues uninterrupted until the target testing time is reached. No accelerated stress testing time is lost as is the case with the conventional accelerated testing protocols when the accelerated testing is interrupted at each testing point and the ICs are removed from the burn-in mother board so the functionality of each IC may be tested. Elimination of these testing point interruptions saves approximately 2 weeks testing time for a typical accelerated stress test.

Additionally testing time is shortened because the MCU 422 driven stress testing is faster than burn-in computer 100 or driver board 102 driven stress testing. With driver board 102 driven testing the stress commands typically travel at least 30 cm from the driver board 102 to the IC 106 under test. With MCU 422 driven testing the stress commands travel at most a few centimeters so it can send and receive digital signals much faster. The maximum stress testing speed with conventional driver board 102 driven stress testing is about 10 MHz. Testing speeds of 25 MHz or more may be reached with the MCU 422 driven stress testing on a burn-in daughter board 314.

These reductions in accelerated stress testing time translates into a significant cost saving. For example for a current technology this embodiment may save between $30,000 to $60,000 per device qualification depending upon the project scope.

Using the conventional accelerated testing protocol, removal and reinsertion of the ICs into the burn-in mother board, may cause and ESD event that results in failure of the packaged IC. In addition, stress applied to the package and package pins during removal from and reinsertion into the burn-in board may cause a bondwire to break or the package to crack also causing the packaged IC to fail. These handling failures may be misinterpreted as being caused by the accelerated testing, contaminate the testing results, causing the packaged IC to fail qualification.

Another advantage of this embodiment is that accelerated stress testing may be stopped as soon as the packaged IC shows signs of failure. This preserves the packaged IC at the instant of failure so that failure analysis (FA) may be performed to determine which subcircuit and which device within the subcircuit failed first. With the conventional method, the accelerated stress conditions may continue for a prolonged period of time after the packaged IC has failed. The additional accelerated stress may result in so much damage that failure analysis on the packaged IC becomes impossible.

Figure 6:
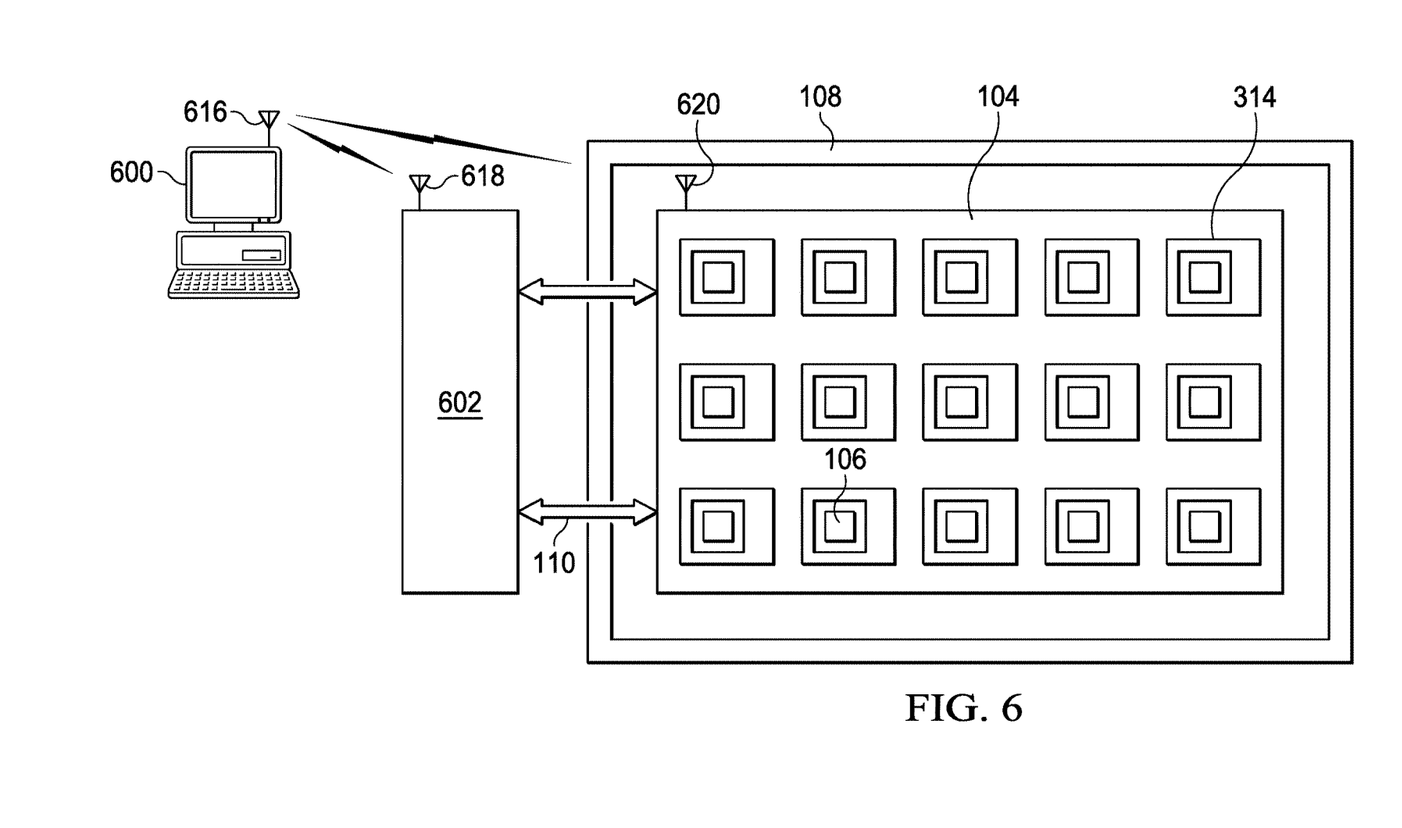
FIG. 6 is a plan view of an apparatus for the insitu testing of integrated circuit under stress illustrating an embodiment of the principles of the invention

Another embodiment is illustrated in FIG. 6.

In this embodiment a customized driver interface 602 may be designed to enable the PC 600 to individually program the MCUs 422 on the burn-in daughter boards 314 after the burn-in mother board 104 is populated with the burn-in daughter boards 314.

In addition, a customized driver interface 602 may be designed to enable the PC 600 to download data from the memories 424 on the burn-in daughter boards 314 during accelerated stress testing (for example after a failure of one of the packaged ICs 106) or after the accelerated stress testing of all the packaged ICs 106 is complete.

The embodiment shown in FIG. 6 also illustrates that wireless capability 616 may be added to the computer 600 and to the driver/interface board 602 (618) or the mother board 104 (620). Accelerated testing instructions may be communicated to the MCUs 422 and the data may be downloaded from the memories 424 wirelessly (ie. via Bluetooth connections).

Figure 7:
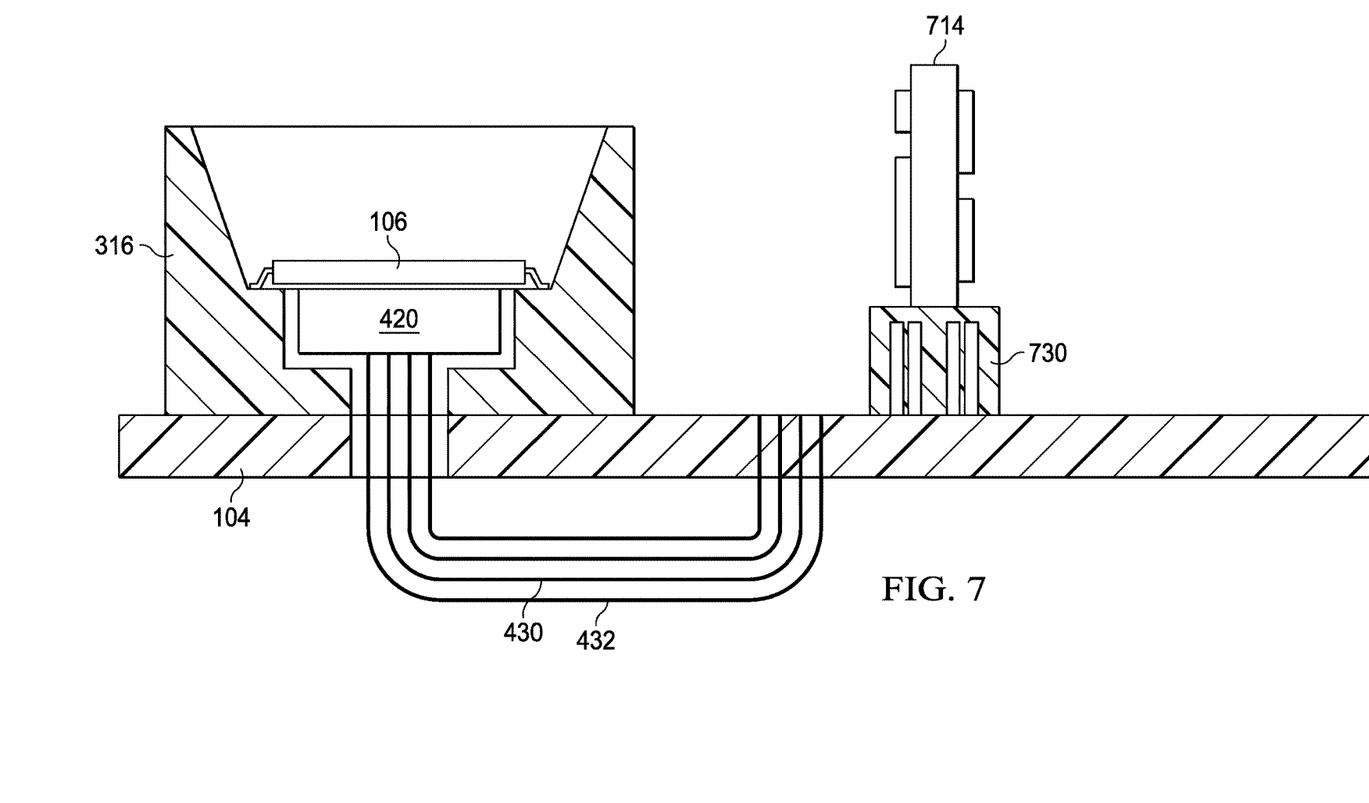
FIG. 7 is a cross section of a mother board with a heater socket and with a modified daughter burn-in board illustrating an embodiment of the principles of the invention.

Another embodiment is illustrated in FIG. 7. In this embodiment the heater socket 316 is mounted directly on the burn-in mother board 104. A modified burn-in daughter board 714 containing the MCU 422, the on board memory 424, the DB select circuitry 426, and other circuitry may be mounted vertically by plugging it into a card to board interface socket 730 mounted on the burn-in mother board 104. This may significantly reduce area occupied by the burn-in daughter board 714 enabling more heater sockets 316 to be mounted on the burn-in mother board 104 so that more packaged ICs 106 may be simultaneously stress tested. In addition, should a component on the modified daughter burn-in board 714 fail, this embodiment enables the failed daughter board 714 to be replaced without interrupting ongoing stress testing.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An apparatus comprising:
    a burn-in board;
    a microcontroller unit (MCU) mounted on the burn-in board;
    a heater socket defining an open top for receiving a packaged integrated circuit and the heater socket coupled with the MCU; and
    a heater in the heater socket with the heater positioned to contact a bottom portion of the packaged integrated circuit when the packaged integrated circuit is inserted into the heater socket and over the heater.

2. The apparatus of claim 1, further comprising a burn-in mother board having a plugin socket configured to receive the burn-in board and wherein the heater socket is mounted on the burn-in board.

3. The apparatus of claim 2, wherein the burn-in board is orthogonally arranged with the burn-in mother board.

4. The apparatus of claim 1, further comprising:
    a burn-in mother board, wherein the heater socket is mounted on the burn-in mother board; and
    a plugin socket mounted on the burn-in mother board and configured to receive the burn-in board.

5. The apparatus of claim 1 further comprising an accelerated stress voltage source and the stress voltage source coupled with the MCU.

6. The apparatus of claim 1 further comprising:
    a first computer configured to program the MCU; and
    a second computer to implement an accelerated burn-in test.

7. The apparatus of claim 1, further comprising a computer configured to program the MCU and to implement an accelerated burn-in test.

8. The apparatus of claim 1 further comprising:
    a first burn-in board and a second burn-in board;
    a first heater socket and a second heater socket,
    a first MCU and a second MCU;
    a burn-in mother board having a first plugin socket configured to receive the first burn-in board and wherein the first heater socket is mounted on the first burn-in board and is coupled to the first MCU, and having a second plugin socket configured to receive the second burn-in board and wherein the second heater socket is mounted on the second burn-in board and is coupled to the second MCU.

9. The apparatus of claim 1, further comprising:
    a first burn-in board and a second burn-in board;
    a first heater socket and a second heater socket;
    a burn-in mother board, wherein the first heater socket and the second heater socket are mounted on the burn-in mother board;
    a first plugin socket mounted on the burn-in mother board and wherein the first plugin socket is coupled to the first heater socket and wherein the first plugin socket is configured to receive the first burn-in board; and
    a second plugin socket mounted on the burn-in mother board and wherein the second plugin socket is coupled to the second heater socket and wherein the second plugin socket is configured to receive the second burn-in board.

10. A method comprising:
    placing a packaged integrated circuit (IC) over and in contact with a heater mounted to a heater socket mounted on a burn-in board and coupled to a microcontroller unit (MCU) mounted on the burn-in board;
    receiving an actuation instruction by the MCU to actuate the packaged IC;
    receiving a stress instruction by the MCU for applying an accelerated stress to the plugged in packaged IC;
    applying the accelerated stress to the packaged IC based upon the received stress instruction; and
    collecting test data associated with the accelerated stress.

11. The method of claim 10, wherein applying the accelerated stress includes applying by the MCU, a voltage greater than an operating voltage of the packaged IC to the packaged IC.

12. The method of claim 10, wherein applying the accelerated stress includes applying by the MCU a thermal stress to the packaged IC by activating the heater mounted to the heater socket.

13. The method of claim 10, wherein applying the accelerated stress includes applying, by the MCU, a thermal stress by activating the heater mounted to the heater socket, and applying, by the MCU, a voltage greater than an operating voltage of the packaged IC to the packaged IC.

14. The method of claim 10, further comprising:
    plugging the burn-in board into a first side of a communication socket inside a burn-in oven;
    plugging an interface board into a second side of the communication socket outside the burn-in oven; and
    adjusting the burn-in oven based on a target thermal stressing temperature.

15. The method of claim 10 further comprising:
    transferring the testing data into a memory.

16. The method of claim 10 further comprising:
    determining by the MCU, a failure event of the packaged IC while applying the accelerated stress;
    recording test data associated with the detected failure event, the test data including at least one of a time of failure, a failed stress condition, or a failed functional test; and
    transferring the recorded test data into a memory.

17. A method comprising:
    placing a first packaged integrated circuit (IC) over and in contact with a first heater mounted to a first heater socket mounted on a first burn-in board and coupled to a first microcontroller unit (MCU) mounted on the first burn-in board;
    placing a second packaged integrated circuit (IC) over and in contact with a second heater mounted to a second heater socket mounted on a second burn-in board and coupled to a second microcontroller unit (MCU) mounted on the second burn-in board;
    receiving a first actuation instruction by the first MCU to actuate the first packaged IC;
    receiving a second actuation instruction by the second MCU to actuate the second packaged IC;
    receiving a first stress instruction by the first MCU;
    receiving a second stress instruction by the second MCU;
    applying an first accelerated stress to the first packaged IC based upon the received first stress instruction;
    applying an second accelerated stress to the second packaged IC based upon the received second stress instruction;
    collecting first test data associated with the first accelerated stress; and
    collecting second test data associated with the second accelerated stress.

18. The method of claim 17, wherein applying the first accelerated stress includes applying by the first MCU, a first stress voltage greater than a first operating voltage of the first packaged IC to the first packaged IC and wherein applying the second accelerated stress includes applying, by the second MCU, a second stress voltage greater than a second operating voltage of the second packaged IC to the second packaged IC.

19. The method of claim 18, wherein the first stress voltage is different than the second stress voltage.

20. The method of claim 17, wherein applying the first accelerated stress includes applying, by the first MCU, a first thermal stress to the first packaged IC by activating the first heater mounted to the first heater socket, and wherein applying the second accelerated stress includes applying, by the second MCU, a second thermal stress to the second packaged IC by activating the second heater mounted to the second heater socket.

21. The method of claim 20, wherein the first thermal stress is different than the second thermal stress.

22. The method of claim 17 further comprising:
  detecting a failure event of one or more of the first packaged IC or the second packaged IC;
  recording test data associated with the failure event, the test data including at least one of a time of failure, a failed stress condition, or a failed functional test;
  transferring the recorded test data into a memory;
  removing the accelerated stress from the failed packaged IC; and
  deactivating the failed packaged IC.

* * * * *